(12) United States Patent
Bender

(10) Patent No.: US 7,927,126 B1
(45) Date of Patent: Apr. 19, 2011

(54) APPARATUS FOR SECURING A CABLE CONNECTOR TO A DEVICE

(75) Inventor: Shawn Bender, Campbell, CA (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 12/483,436

(22) Filed: Jun. 12, 2009

(51) Int. Cl.
*H01R 13/64* (2006.01)
(52) U.S. Cl. ........................................ 439/369; 439/458
(58) Field of Classification Search .................. 439/367, 439/369, 373, 449, 457, 458
See application file for complete search history.

(56) References Cited

U.S. PATENT DOCUMENTS

| 3,783,436 | A | * | 1/1974 | Bury ............................... 439/470 |
| 5,772,462 | A | * | 6/1998 | Osten ............................. 439/367 |
| 5,913,692 | A | * | 6/1999 | Targett ........................... 439/369 |
| 6,939,161 | B1 | | 9/2005 | Yi et al. |
| 7,648,384 | B2 | * | 1/2010 | Desissard et al. .............. 439/367 |

* cited by examiner

*Primary Examiner* — Khiem Nguyen
(74) *Attorney, Agent, or Firm* — Edell, Shapiro & Finnan, LLC

(57) ABSTRACT

In one embodiment, an apparatus includes a main body defining a channel configured to receive and hold a cable connector. Means for releasably securing the main body to a device are provided. The channel is aligned with a receptacle of the device when the main body is secured to the device. A first resilient member extends outwardly from an inner wall of the main body and into the channel. The first resilient member is deformably tensionable against the cable connector when received and held within the channel.

18 Claims, 13 Drawing Sheets

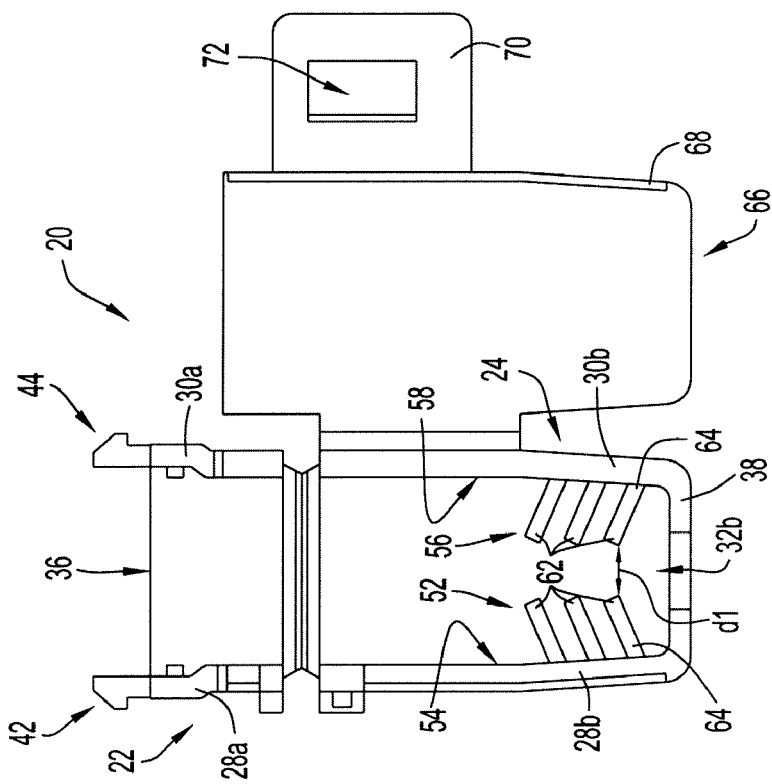
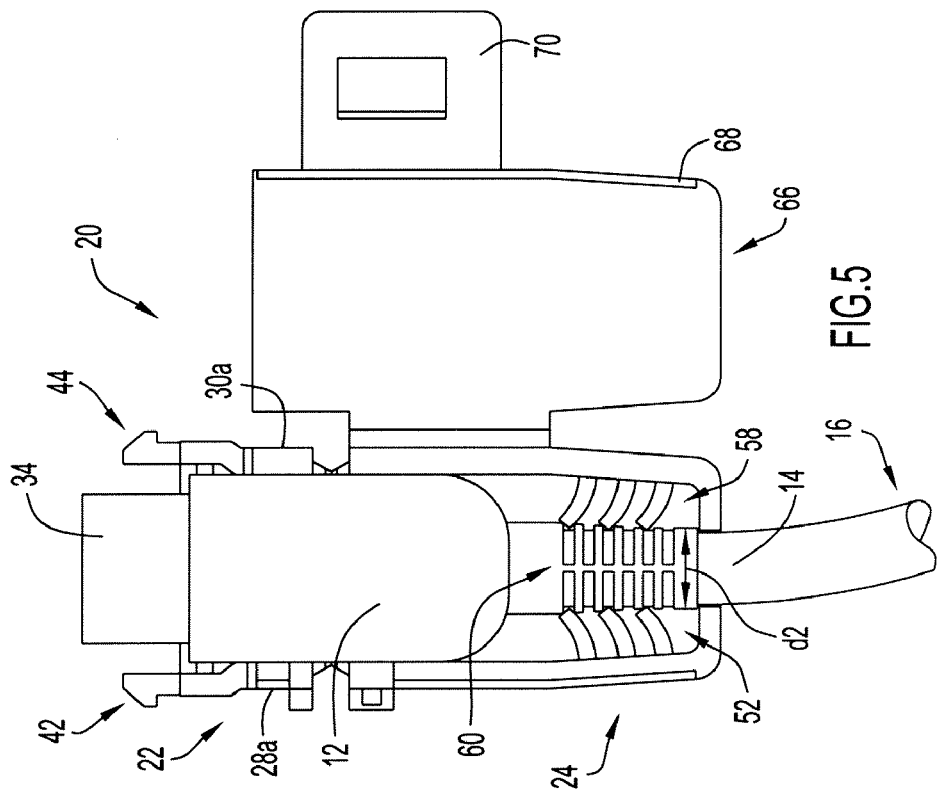

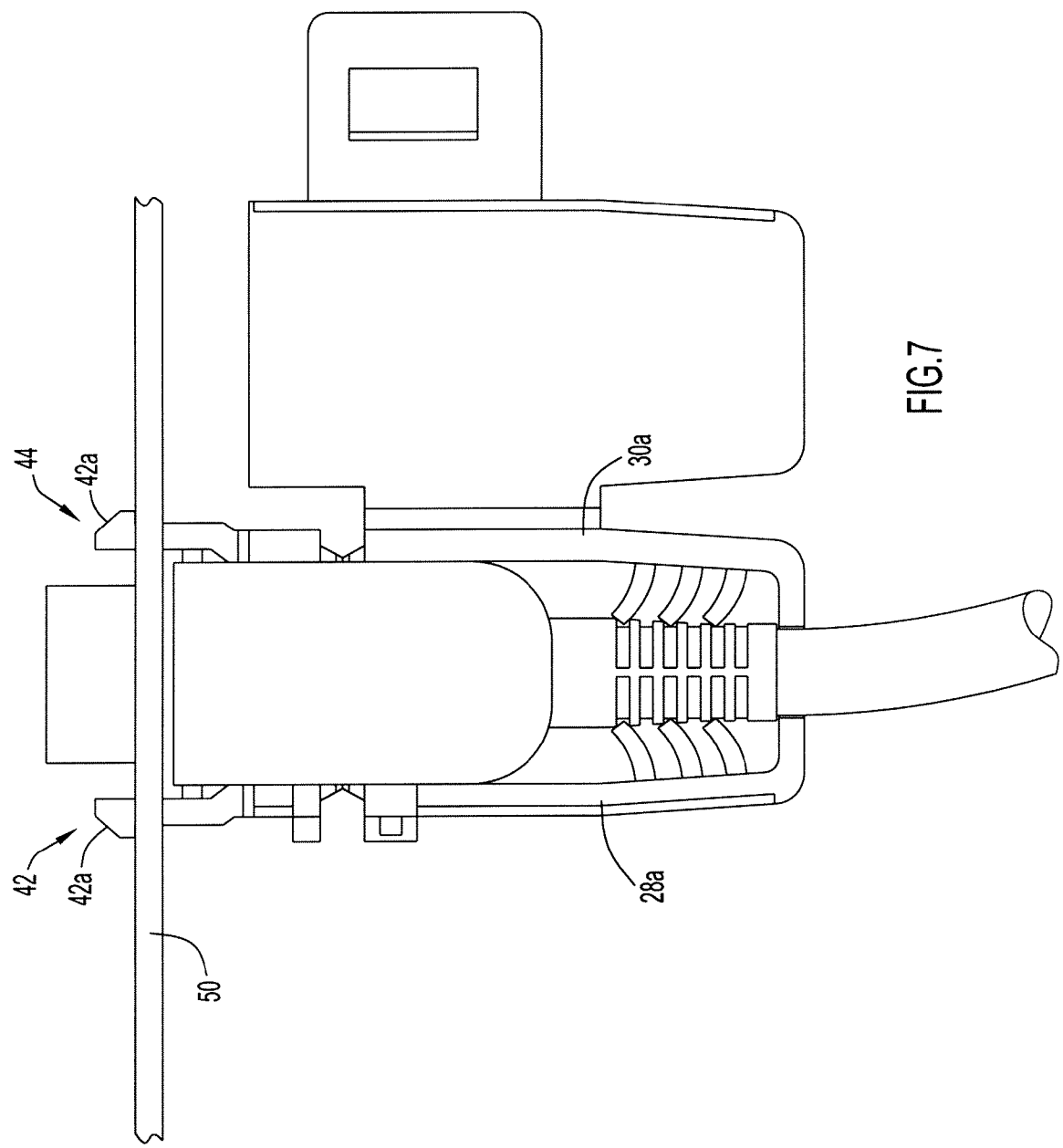

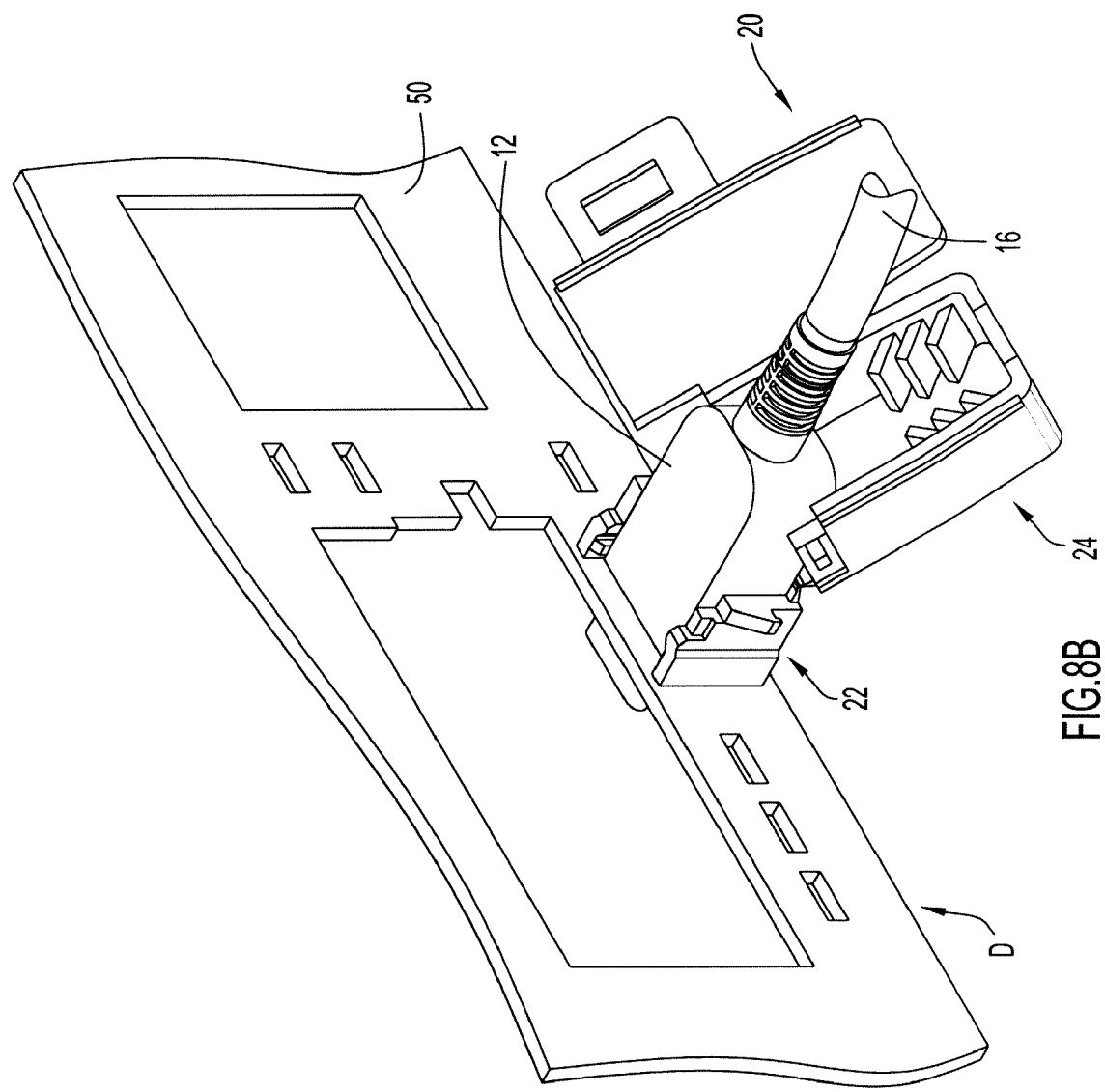

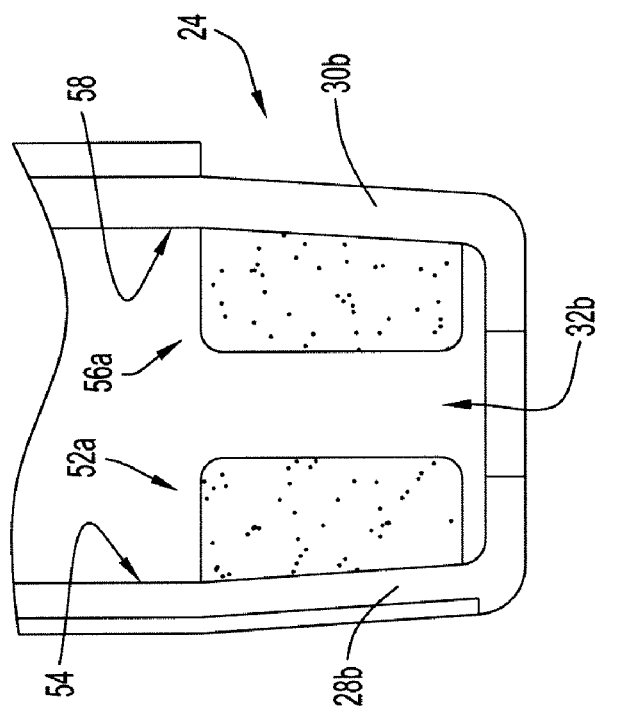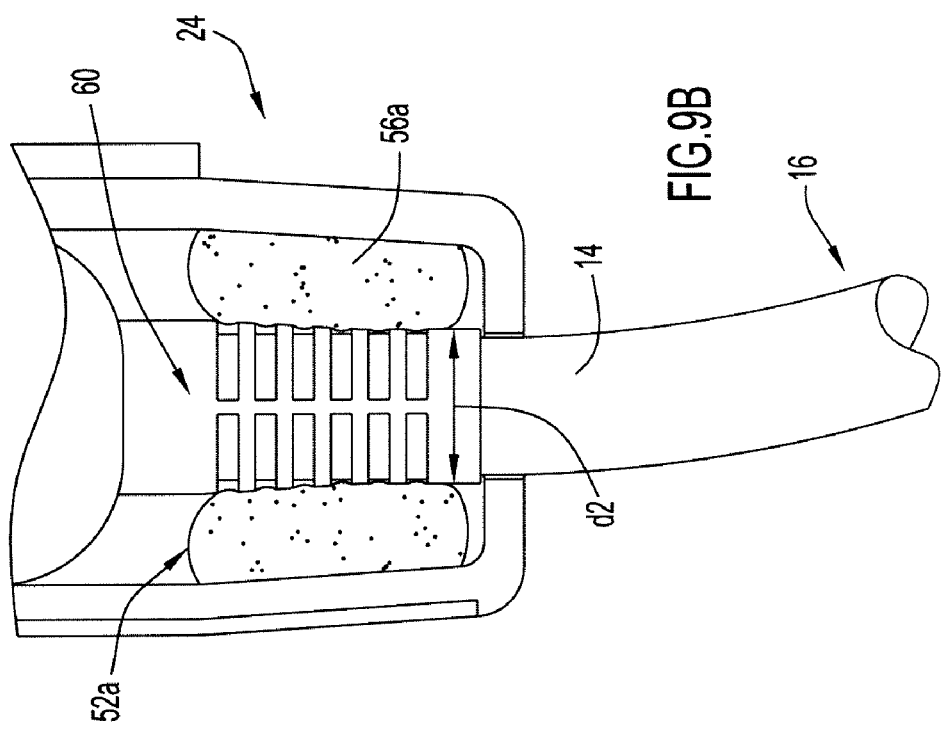

APPARATUS FOR SECURING A CABLE CONNECTOR TO A DEVICE

TECHNICAL FIELD

The present disclosure relates generally to an apparatus for releasably securing a cable connector to a device.

BACKGROUND

There are a variety of different connectors used for connecting a peripheral device to a host device, including for example Universal Serial Bus ("USB") Type A, Type B, Mini-A, Mini-B, Micro-AB and Micro-B connectors. Conventional cable assemblies typically include a plug body connected to a cable. The plug body includes contacts held by an insulative body having a grip portion and a fitting portion for insertion into a corresponding port provided in the chassis of a host device. The grip portion and the fitting portion are typically shielded by a metal shell. Overmolding typically encases the grip portion and a portion of the cable attached thereto.

Conventional USB connectors are generally held is place within the port only by the gripping force of the port. Only moderate insertion/removal force is required for connecting/disconnecting such a connector from a corresponding port. As a result, the force needed to dislodge such a conventional connector from the corresponding port is relatively modest.

BRIEF DESCRIPTION OF THE DRAWINGS

FIG. 5 illustrates a plan view of the cable retention mechanism of FIG. 3 showing a cable connector disposed therein;

FIG. 6 illustrates a plan view of the cable retention mechanism of FIG. 3;

FIG. 7 illustrates a cross-sectional plan view of the cable retention mechanism of FIG. 3 releaseably secured to a chassis of a device;

FIG. 8B illustrates a perspective view of the cable retention mechanism of FIG. 3 releaseably secured to the chassis of a device, and showing a cable connector disposed therein;

FIG. 9A illustrates a fragmentary plan view of a portion of a cable retention mechanism according to another example embodiment;

FIG. 9B illustrates a fragmentary plan view of the portion of the cable retention mechanism shown in FIG. 9A, and showing a portion of a cable assembly disposed therein;

DESCRIPTION OF EXAMPLE EMBODIMENTS

Overview

A cable retention mechanism includes a main body defining a channel configured to receive and hold a cable connector. Means for releasably securing the main body to a device are provided. The channel is aligned with a receptacle of the device when the main body is secured to the device. A first resilient member extends outwardly from an inner wall of the main body and into the channel. The first resilient member is deformably tensionable against the cable connector when it is received and held within the channel.

Figure 1:
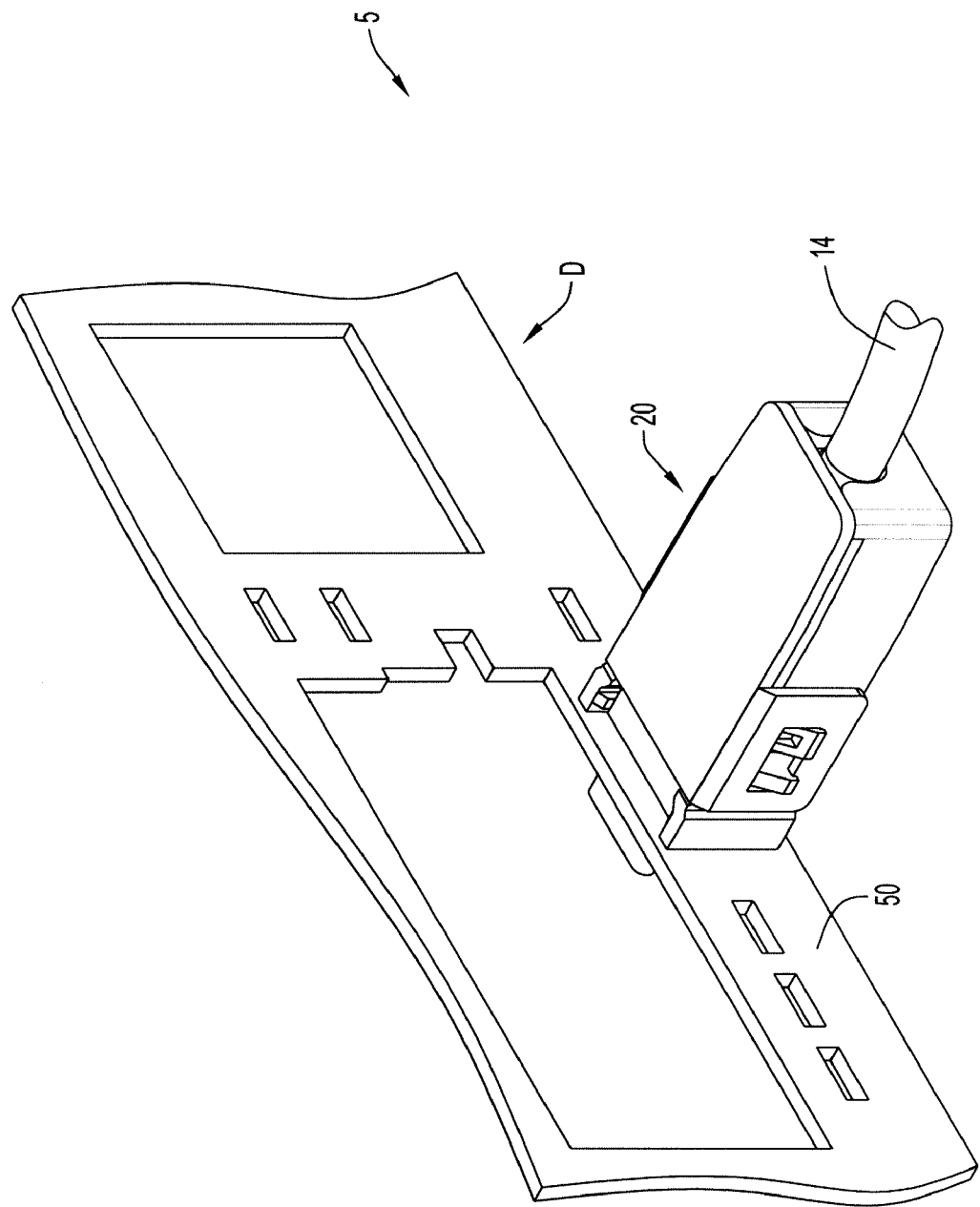
FIG. 1 illustrates a perspective view of an example embodiment of a system releasably securing a cable connector to a device.
Figure 2:
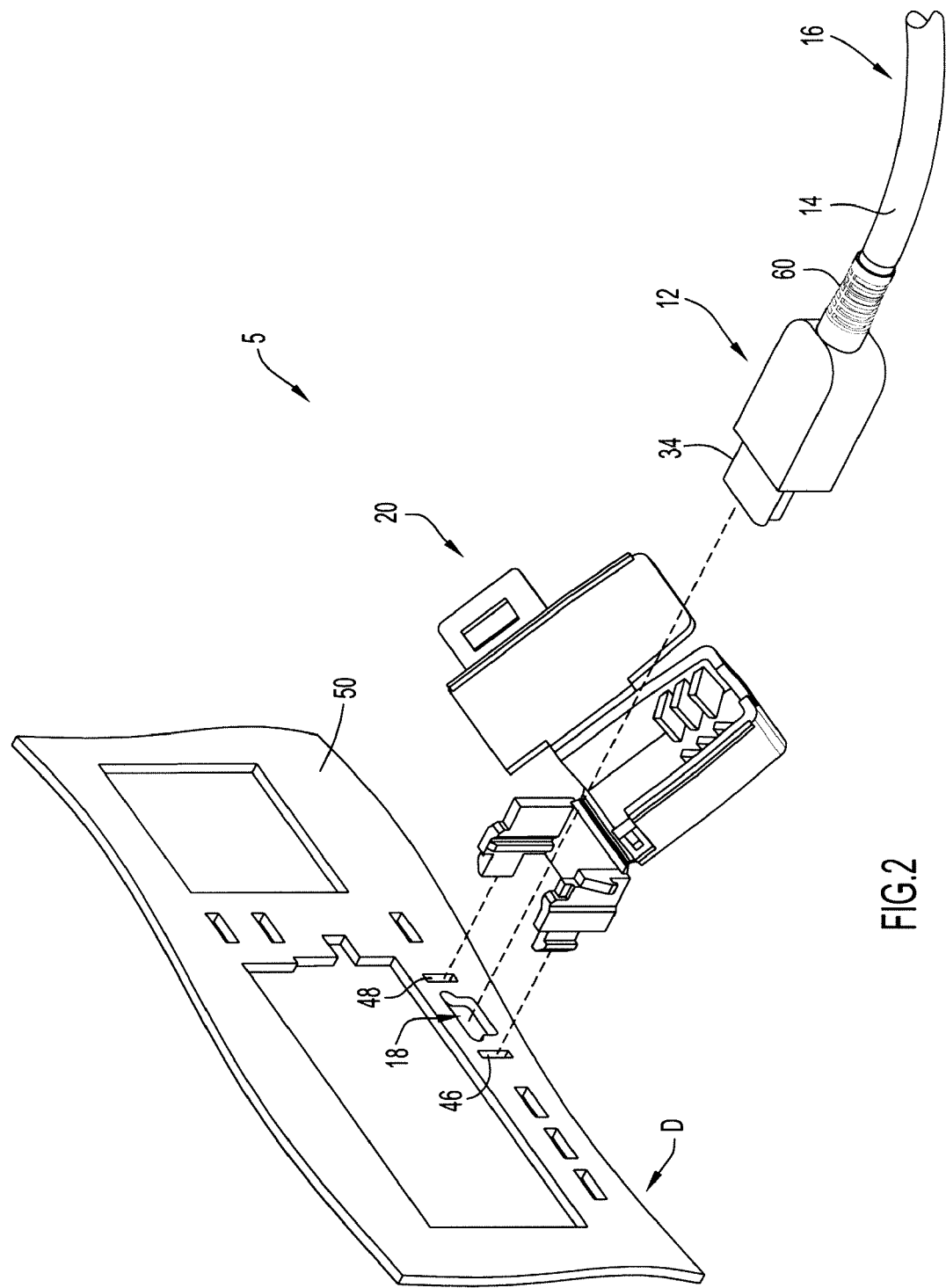
FIG. 2 illustrates a perspective assembly view of the example system of FIG. 1.

Referring to FIGS. 1 and 2, an example embodiment of a system 5 for securing a cable connector 12 to a device D is shown. Cable connector 12 is disposed at an end 14 of a cable 16, and includes a fitting portion 34 configured to be connected to a corresponding receptacle 18 provided on device D. System 5 also includes a cable retention mechanism 20, 200.

Figure 3:
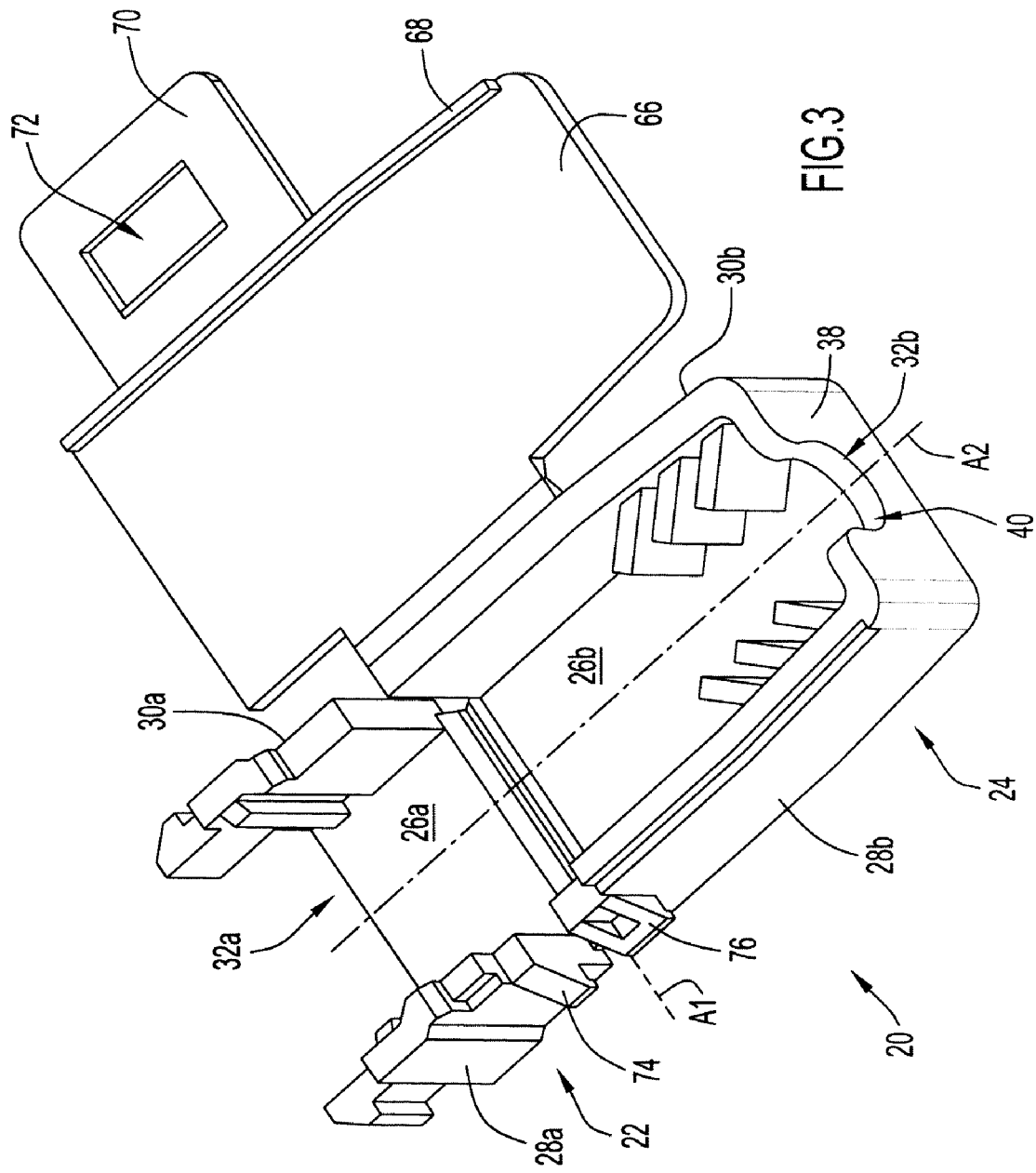
FIG. 3 illustrates a perspective view of an example embodiment of a cable retention mechanism in a first orientation.
Figure 4:
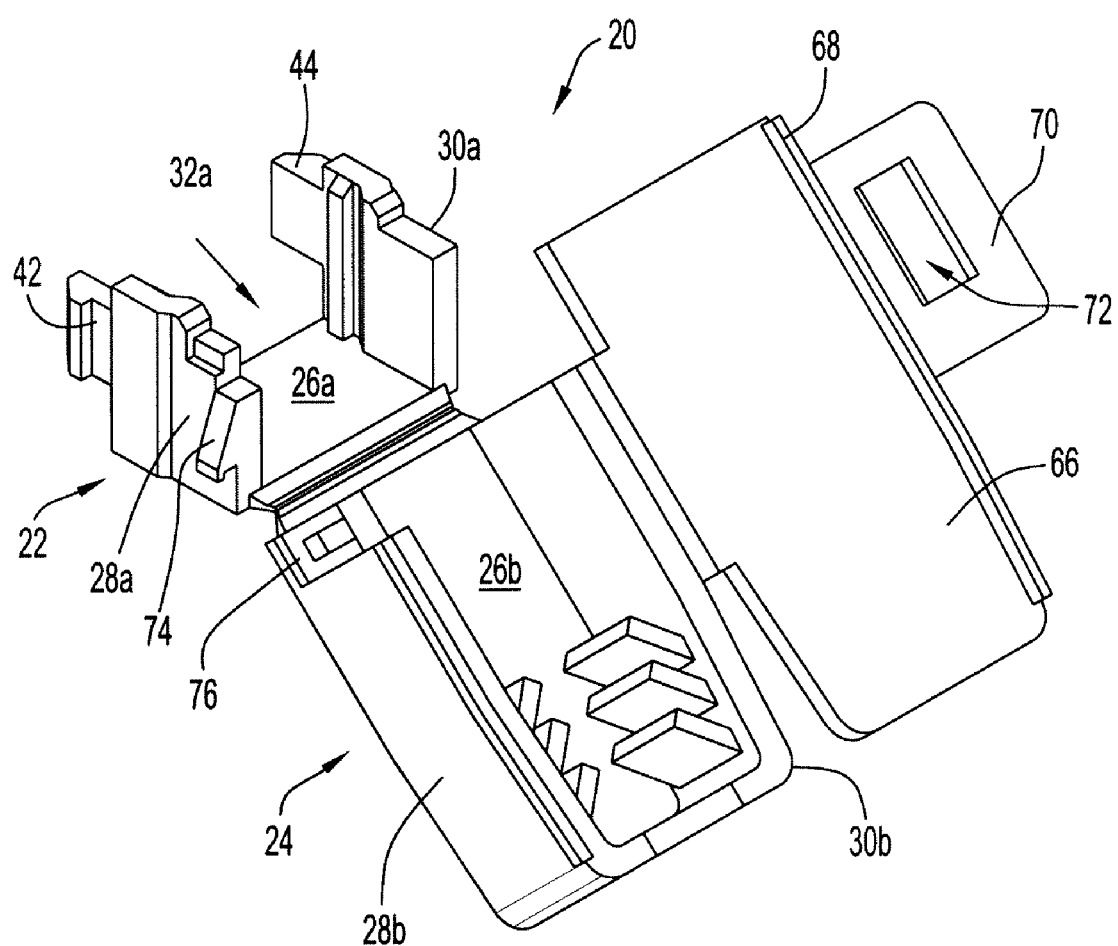
FIG. 4 illustrates a perspective view of the cable retention mechanism of FIG. 3 in a second orientation.

Referring to FIGS. 3 and 4, an example embodiment of cable retention mechanism 20 includes a main body having a first portion 22 hingedly connected to a second portion 24. First portion 22 includes a base 26a and first and second opposite sidewalls 28a, 30a defining a channel 32a. Second portion 24 also includes a base 26b and first and second opposite sidewalls 28b, 30b defining a channel 32b.

In a first orientation shown in FIG. 3, base 26a is substantially coplanar with base 26b, and sidewalls 28a, 30a are aligned with and substantially coplanar with sidewalls 28b, 30b, respectively. In a second orientation shown in FIG. 4, base 26a is angularly disposed relative to base 26b. Second portion 24 is pivotally moveable relative to first portion 22 about an axis A1 that is substantially transverse to a longitudinal central axis A2 of channels 32a, 32b, shown in FIG. 3.

First and second portions 22, 24 are configured to receive and hold cable connector 12 within channels 32a, 32b, as shown in FIG. 5. A fitting portion 34 of cable connector 12 configured to be inserted into the receptacle 18 extends outwardly from a distal end 36 of first portion 22, as shown in FIGS. 5 and 6.

Referring to FIGS. 3 and 5, second portion 24 may include an end wall 38 extending upwardly from the base 26b and interconnecting the sidewalls 28b, 30b. An opening 40 is provided in end wall 38 through which end 14 of cable 16 extends when cable connector 12 is retained within channels 32a, 32b.

Figure 8A:
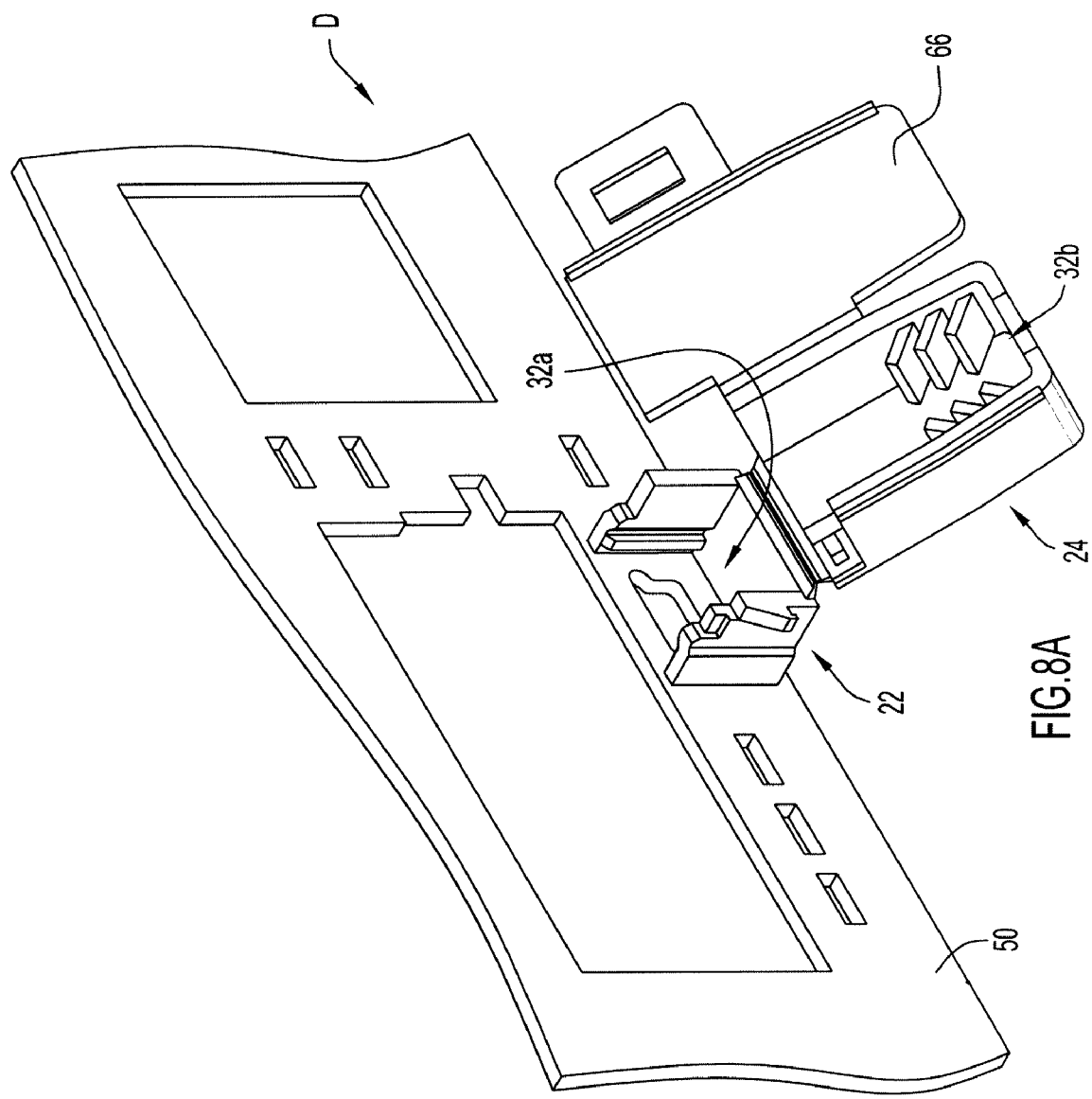
FIG. 8A illustrates a perspective view of the cable retention mechanism of FIG. 3 releaseably secured to the chassis of a device.

Referring to FIGS. 6, 7 and 8A, first portion 22 of the cable retention mechanism 20 may be secured to device D via a pair of latches 42, 44 extending outwardly from sidewalls 28a, 30a proximate distal end 36 thereof. Latches 42, 44 are preferably configured to be releaseably secured within corresponding openings 46, 48 in a chassis 50 of device D adjacent receptacle 18, as shown in FIG. 2. When secured to chassis 50, channel 32a of first portion 22 is aligned with receptacle 18, as shown in FIG. 8A. Cable connector 12 may then be inserted into channel 32a, and slid forward toward chassis 50 so that fitting portion 34 is connected to receptacle 18, as shown in FIG. 8B.

Latches 42, 44 may include ramped edges 42a, 44a that engage the periphery of openings 46, 48, as shown in FIG. 7. As ramped edges 42a, 44a are pushed against and into openings 46, 48, latches 42, 44 and/or sidewalls 28a, 30a deform inwardly toward each other until ramped edges 42a, 44a extend past the wall of chassis 50. Ramped edges 42a, 44a then spring outwardly and away from each other, due to the resilient characteristics of the material from which they are formed, thereby releasably locking cable retention mechanism 20 to chassis 50. To detach cable retention mechanism 20 from chassis 50, an inward force may be applied to sidewalls 28a, 30a, until latches 42, 44 are sufficiently deformed permitting ramped edges 42a, 44a to pass through openings 46, 48.

Alternatively, other means for securing cable retention mechanism 20 to device D may be provided. For example, one or more flexible straps or portions of hook and loop material may extend from or proximate first end 36 of cable retention mechanism 20, which may be releaseably secured to a corresponding hook and loop material provided on chassis 50 proximate receptacle 18. Alternatively, cable retention mechanism 20 may be adhesively secured to chassis 50. Alternatively, cable retention mechanism 20 may be secured to chassis 50 via screws or pins, which for example may extend through flanges extending outwardly from sidewalls 28a, 30a proximate first end 36 thereof, and into corresponding holes provided in chassis 50. Thus, it should be understood that various mechanisms for fastening cable retention mechanism 20 to chassis 50 may be employed, so that channel 32a is aligned with receptacle 18 when cable retention mechanism 20 is secured to device D.

Referring again to FIGS. 5 and 6, second portion 24 of cable retention mechanism 20 may include a first resilient member 52 extending outwardly from an inner surface 54 of first sidewall 28b and into channel 32b, and a second resilient member 56 extending outwardly from an inner surface 58 of second sidewall 30b and into channel 32b. Resilient members 52, 56 are deformably tensioned against cable connector 12, preferably against an overmold portion 60 provided around and interconnecting end 14 and cable connector 12 when cable connector 12 is disposed within channel 32b. In this way, cable connector 12 may be received and held between the opposing resilient members 52, 56.

In an example embodiment, each of resilient members 52, 56 has a featherboard configuration, including at least one, and preferably a plurality, of deformably resilient panel members 62. Each panel member 62 may have a substantially rectangular configuration, connected to a corresponding one of inner surfaces 54, 58 along a longitudinal edge 64 thereof. Panel members 62 extend outwardly from and preferably angularly relative to inner surfaces 54, 58 toward first portion 22. Thus, panel members 62 are preferably angularly disposed relative to the longitudinal central axis A2 of channel 32b.

Each panel member 62 is preferably resiliently flexible. In addition, the distance d1 between panel members 62 extending from inner surface 54 and panel members 62 extending from the inner surface 58 is preferably slightly less than the width d2 of overmold portion 60. In this way, panel members 62 are tensionably deformed away from the longitudinal central axis A2 of channel 32b by overmold portion 60 of cable connector 12, as shown in FIG. 5. Overmolding often includes a series of outwardly extending ridges, and thus typically has a diameter greater than the diameter of the cable. The distal edges of panel members 62 may be received between such ridges provided on overmold portion 60. The angular orientation of panel members 62 relative to inner surfaces 54, 58, as well as the tensioning of panels 62 against and between ridges in overmold portion 60, maintains cable connector 12 securely within cable retention mechanism 20.

Moreover, because resilient members 52, 56 are resiliently deformable, cable retention mechanism 20 can accommodate differently sized cable connectors 12. Resilient members 52, 56 deform outwardly by the cable connector 12 when received within channel 32b, maintaining tension against overmold portion 60 or end 14. Further, the angularly configuration of panel members 62 ensure that cable connector 12 does not slid out of the receptacle 18. Panel members 62, particularly when disposed within ridges of overmold portion 60, act as braces that impede cable connector 12 from sliding out of and away from receptacle 18. Any outward force applied to cable connector 12, relative to receptacle 18, is transferred to panel members 62, which will not easily bend back toward end wall 38. Further, end wall 38 ensures that cable connector 12 is retained within channels 32a, 32b given the diameter of opening 40 therein is sized to fit end 14 but is less than the overall diameter of cable connector 12, as shown in FIG. 5.

It should be understood that the featherboard configuration of resilient members 52, 56 comprising panel members 62 is provided as an example only. Alternative configurations for resilient members 52, 56 may be provided. For example, an alternative configuration of resilient members 52a, 56a is shown in FIGS. 9A, 9B, wherein each of resilient members 52a, 56a is configured as a block of foam or other resilient material extending outwardly from corresponding inner surfaces 54, 58. Alternatively, a resilient member may extend from only one of the inner surfaces 54 or 58.

Referring again to FIGS. 3, 4 and 6, cable retention mechanism 20 preferably includes a cover 66 hingedly connected to sidewall 30b of second portion 24. A distal edge 68 of cover 66 may be pivoted between an open position allowing access to channels 32a, 32b, and a closed position against sidewalls 28a, 28b as shown in FIG. 1. Distal edge 68 of cover 66 may have a lip or flange configuration that engages sidewalls 28a, 28b for a friction fit, so that cover 66 may snap closed.

Alternatively or in addition, cover 66 may include a lock plate 70 hingedly connected to distal edge 68 thereof. Lock plate 70 may include an aperture 72. A first engagement member 74 is connected to and extends outwardly from sidewall 28a, and a second engagement member 76 is connected to and extends outwardly from sidewall 28b. Engagement members 74, 76 are releaseably secured within aperture 72, such as by a friction or snap fit, when cover 66 is pivoted to the closed position and lock plate 70 is pivoted downwardly against sidewalls 28a, 28b as shown in FIG. 1.

When first and second engagement members 74, 76 are received within aperture 72, cover 66 is releaseably maintained in the closed position. In addition, first and second portions 22, 24 are retained in a fixed position relative to each other when engagement members 74, 76 are retained within aperture 72. Base 26a of first portion 22 is substantially coplanar to base 26b of second portion 24 when cover 66 is locked in the closed position via lock plate 70 and engagement members 74, 76.

A method of securing cable connector 12 to a device D using cable retention mechanism will now be described. As described above, cable retention mechanism 20 may include latches 42, 44 that are releaseably secured within corresponding openings 46, 48 of the chassis 50. Alternatively, cable retention mechanism 20 may be secured to chassis 50 via a hook and loop fastener mechanism, adhesive, screws or pins, or some other such fastening mechanism, as noted above.

Channel 32a is aligned with receptacle 18 when cable retention mechanism 20 is properly secured to chassis 50, as shown in FIG. 8A.

With cover 66 pivoted to the open position, cable connector 12 is inserted into channel 32a and fitting portion 34 slid into engagement within receptacle 18, as shown in FIG. 8B. Second portion 24 is then pivoted upwardly toward cable connector 12, until resilient members 52, 56 engage and are tensionably deformed against cable connector 12, preferably against overmold 60, and base 26b is coplanar with base 26a. Cover 66 is then pivoted to the closed position and engagement members 74, 76 snapped into aperture 72 of lock plate 70, thereby locking bases 26a, 26b in a fixed position relative to each other and securing cable connector 12 within channels 32a, 32b, as shown in FIG. 1.

Figure 10:
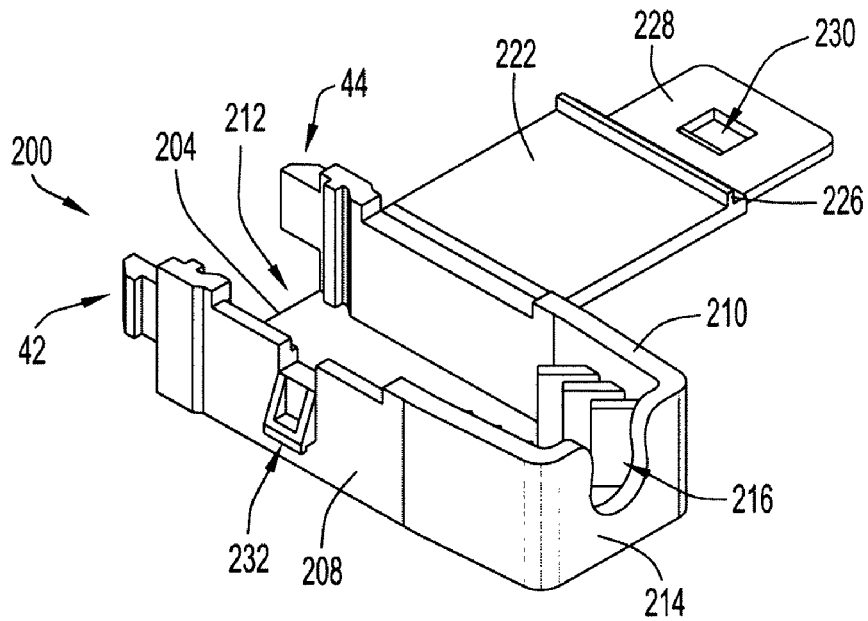
FIG. 10 illustrates a perspective view of another example embodiment of a cable retention mechanism.
Figure 11:
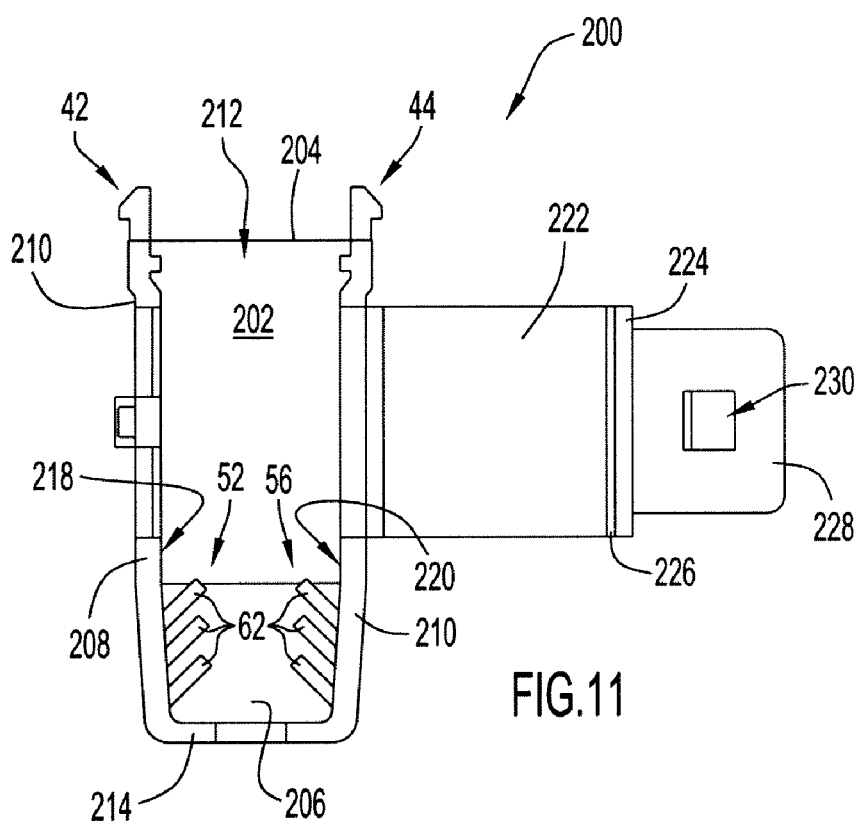
FIG. 11 illustrates a plan view of the cable retention mechanism of FIG. 10.
Figure 12:
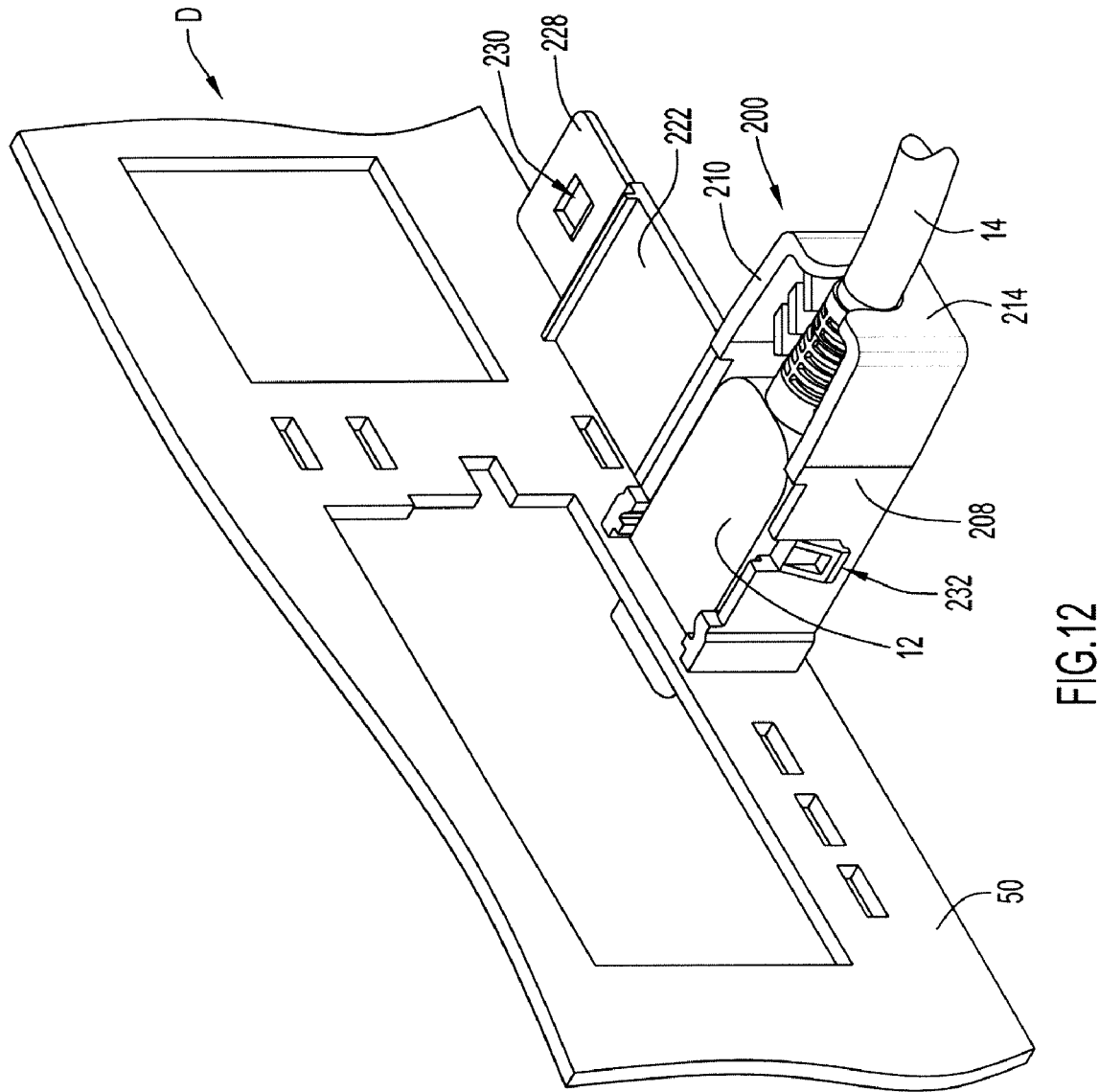
FIG. 12 illustrates a perspective view of the cable retention mechanism of FIG. 10 connected to a chassis of a device, and showing a cable connector disposed therein.

Referring to FIGS. 10 and 11, a cable retention mechanism 200 according to another example embodiment is shown. Cable retention mechanism 200 includes a unitary main body, as opposed to first and second hingedly attached portions as provided with cable retention mechanism 20. Specifically, cable retention mechanism 200 includes a main body having a base 202, first and second opposite ends 204, 206, and first and second opposite sidewalls 208, 210 defining a channel 212 configured to receive and hold cable connector 12, as shown in FIG. 12. Fitting portion 34 (shown in FIG. 2) of cable connector 12 extends outwardly from first end 204 for connecting to receptacle 18. An end wall 214 having an opening 216 may extend upwardly from second end 206, interconnecting distal ends of sidewalls 208, 210. Similar to opening 40 in end wall 38, end 14 of cable 16 extends through opening 216 when cable connector 12 is retained within channel 212.

Figure 13:
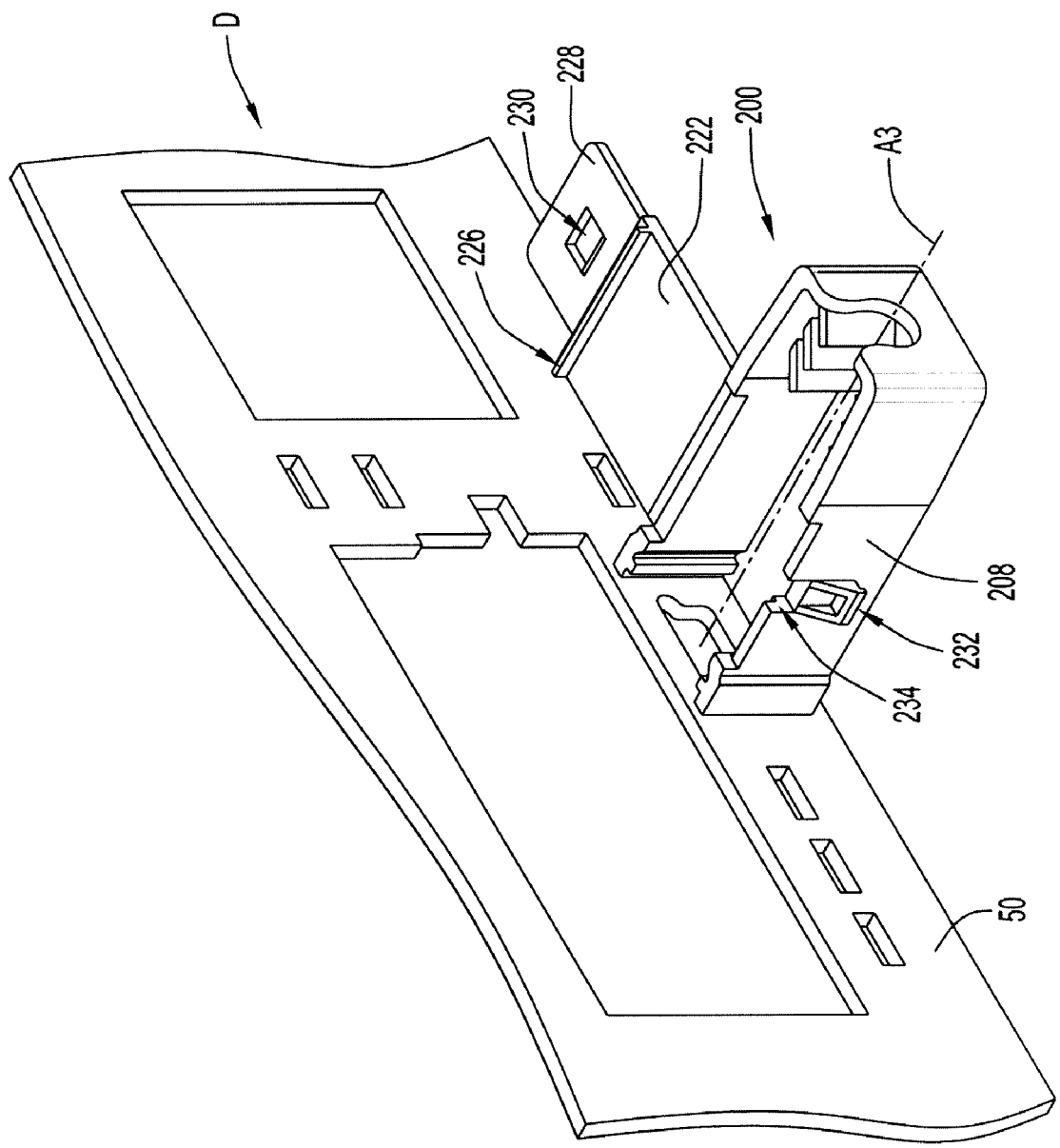
FIG. 13 illustrates a perspective view of the cable retention mechanism of FIG. 12 connected to a chassis of a device, without the cable connector disposed therein.

Cable retention mechanism 200 may be secured to device D via latches 42, 44, as described above. Latches 42, 44 extend outwardly from sidewalls 208, 210 proximate first end 204, and are configured to be releasably secured within corresponding openings 46, 48 in chassis 50. When secured therein, a longitudinal central axis A3 of channel 212 is aligned with receptacle 18, as shown in FIG. 13.

Alternatively, other means for securing the cable retention mechanism 200 to the device D may be provided, as described above.

Referring again to FIG. 11, cable retention mechanism 200 may include first and second resilient members 52, 56, which extend outwardly from corresponding inner surfaces 218, 220 of first and second sidewalls 208, 210, respectively. Resilient members 52, 56 are deformably tensioned against cable connector 12, preferably against overmold portion 60, when cable connector 12 is disposed within channel 212. Further, cable retention mechanism 200 may include resilient members 52, 56 having a featherboard configuration comprising a plurality of panel members 62 extending angularly relative to the corresponding inner surfaces 218, 220, and toward first end 204.

Cable retention mechanism 200 may include resilient members having an alternative configuration, such as resilient members 52a, 56a as shown in FIGS. 9A and 9B.

Figure 14:
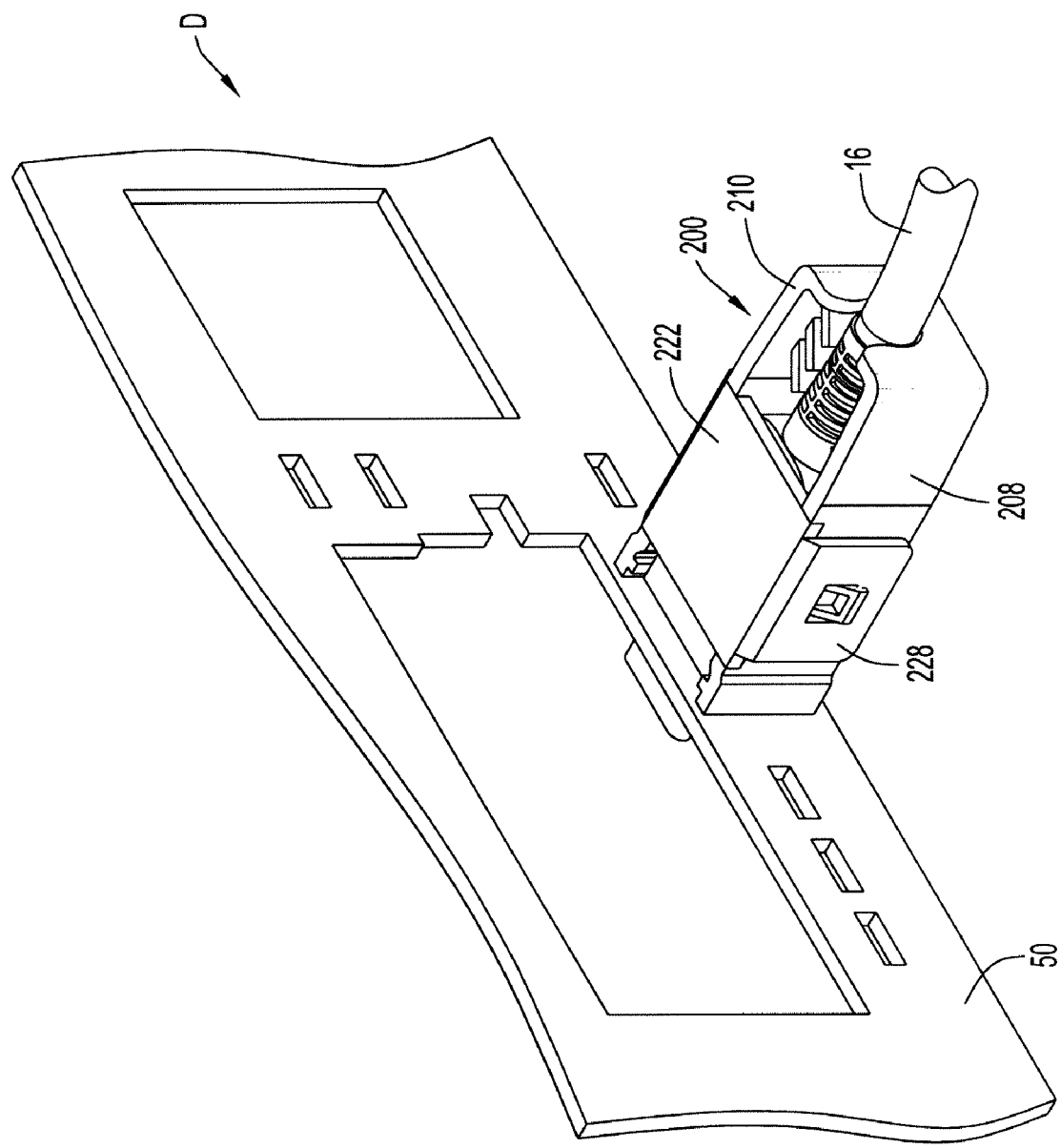
FIG. 14 illustrates a perspective view of the cable retention mechanism of FIG. 10 connected to the chassis of a device, and showing the cable connector connected to the device and releaseably secured within the cable retention mechanism.

Cable retention mechanism 200 may include a cover 222 hingedly connected to second sidewall 210. Similar to cover 66, a distal edge 224 of cover 222 is pivotal between an open position allowing access to channel 212 as shown in FIGS. 12 and 13, and a closed position against first sidewall 208 as shown in FIG. 14. Distal edge 224 of cover 66 may have a lip or flange 226 that engages a corresponding configured step 234 disposed in first sidewall 208, as shown in FIG. 13, so that cover 222 may snap closed.

Alternatively or in addition, cover 222 may include a lock plate 228 hingedly connected to distal edge 224 thereof. Lock plate 228 may include an aperture 230. An engagement member 232 is connected to and extends outwardly from first sidewall 208. Engagement member 232 is releaseably secured within aperture 230, such as by a friction or snap fit, when cover 222 is pivoted to the closed position and lock plate 228 is pivoted downwardly against first sidewall 208, as shown in FIG. 14.

A method of securing cable connector 12 to device D using cable retention mechanism 200 will now be described. Cable retention mechanism 200 may be secured to device D via latches 42, 44 or some other fastening mechanism, as described above. Channel 212 is aligned with receptacle 18 when cable retention mechanism 200 is properly secured to chassis 50, as shown in FIG. 13.

With cover 222 pivoted to the open position, cable connector 12 is inserted into channel 212, as shown in FIG. 12, with fitting portion 34 pointing downwardly and angularly disposed relative to chassis 50. Alternatively or in addition, cable retention mechanism 200 may be angled relative to chassis 50 by pushing downwardly on end wall 214, thereby deflecting chassis 50 in order to provide sufficient clearance for fitting portion 34 to be inserted into receptacle 18. Once inserted within receptacle 18, the downward force applied to second end 206 is released, so that cable connector 12 is seated within channel 212. When seated therein, resilient members 52, 56 are tensioned against overmold 60, as described above. Cover 222 is then pivoted to the closed position and engagement member 232 snapped into aperture 230 of lock plate 228. In this way, cable connector 12 is releasably encased within cable retention mechanism 200, as shown in FIG. 14, thereby securing cable connector 12 to device D.

Cable retention mechanism 20, 200 is suitable for use with a variety of differently configured cable connectors, given resilient members 52, 56 (or 52a, 56a) deform outwardly to allow space for cable connector 12 within channels 32a, 32b or channel 212. So long as cable connector 12 fits within channels 32a, 32b, or channel 212, resilient members 52, 56 (or 52a, 56a) deform to accommodate variously sized and configured cable connectors, such as various USB connectors.

System 5 including cable retention mechanism 20 or 200 therefore provides a much more secure connection between cable connector 12 and receptacle 18, compared to a conventional friction fit connection. Even if cable 16 is inadvertently pulled, cable connector 12 is retained within receptacle 18 by cable retention mechanism 20, 200.

Although the apparatus, system, and method are illustrated and described herein as embodied in one or more specific examples, it is nevertheless not intended to be limited to the details shown, since various modifications and structural changes may be made therein without departing from the scope of the apparatus, system, and method and within the scope and range of equivalents of the claims. Further, it is to be understood that terms such as "left", "right", "front", "rear", "side", "end", "width", "inner", "outer" and the like as may be used herein, merely describe points or portions of reference and do not limit the present invention to any particular orientation or configuration. Further, terms such as "first", "second", "third", etc., merely identify one of a number of portions or components as disclosed herein, and do not limit the present invention to any particular configuration. Accordingly, it is appropriate that the appended claims be construed broadly and in a manner consistent with the scope of the apparatus, system, and method, as set forth in the following claims.

What is claimed is:

1. An apparatus comprising:
a main body having a base and first and second sidewalls extending upwardly therefrom and defining a channel configured to receive and hold a cable connector, wherein said main body includes a first portion hingedly connected to a second portion;
means for releasably securing said main body to a device so that said channel is aligned with a receptacle of the device when secured thereto;
a first resilient member extending outwardly from an inner wall of said first sidewall and into said channel; and
a second resilient member extending outwardly from an inner wall of said second sidewall and into said channel, said first and second resilient members deformably tensionable against the cable connector when received within said channel and connected to the receptacle so that the cable connector is held between said first and second resilient members,
wherein said means for releasably securing said main body to the device is connected to said first portion and said first and second resilient members are connected to said second portion.

2. The apparatus of claim 1, wherein said means for releasably securing said main body to the device includes a pair of latches extending outwardly from said first and second sidewalls proximate a first end of said main body, each one of said pair of latches configured to be releaseably securable within a corresponding opening in the device adjacent the receptacle.

3. The apparatus of claim 1, wherein said first resilient member includes a plurality of panels spaced along a longitudinal axis of said channel, said plurality of spaced panels extending outwardly from said inner wall and angularly relative to the longitudinal axis of said channel.

4. The apparatus of claim 1, further comprising a cover having a first edge hingedly connected to said second sidewall and a distal second edge releasably securable to said first sidewall, said cover pivotally moveable between an open position for providing access to said channel and a closed position for securing the cable connector within said channel.

5. The apparatus of claim 4, wherein said cover includes a lock plate hingedly connected to said distal second edge, said lock plate having an aperture, and said first sidewall having an engagement member extending outwardly therefrom and releaseably securable within said aperture when said cover is pivoted to said closed position and said lock plate is pivoted against said first sidewall.

6. The apparatus of claim 1, wherein said first portion is pivotal relative to said second portion about an axis substantially transverse to a longitudinal axis of said channel.

7. The apparatus of claim 1, further comprising a cover having a first edge hingedly connected to said second sidewall and a distal second edge securable to said first sidewall, said cover pivotally moveable between an open position for providing access to said channel and a closed position for securing the cable connector within said channel.

8. The apparatus of claim 7, further comprising:
a lock plate hingedly connected to said distal second edge and including an aperture;
a first engagement member extending outwardly from said first portion; and
a second engagement member extending outwardly from said second portion, wherein said first and second engagement members are releaseably securable within said aperture when said cover is in said closed position and said base of said first portion is substantially coplanar with said base of said second portion.

9. An apparatus comprising:
a main body having a base and first and second sidewalls extending upwardly therefrom and defining a channel configured to receive and hold a cable connector;
a latch extending outwardly from a first end of said main body, said latch configured to be releaseably securable within a corresponding opening in a device, said channel aligned with a receptacle of the device when said latch is secured within the opening; and
a first resilient member extending outwardly from an inner wall of said first sidewall and into said channel, said first resilient member deformably tensionable against the cable connector when received and held within said channel, wherein said first resilient member includes a plurality of panels spaced along a longitudinal axis of said channel, said plurality of panels extending outwardly from said inner wall and angularly relative to the longitudinal axis of said channel.

10. The apparatus of claim 9, further comprising a second resilient member extending outwardly from an inner wall of said second sidewall and into said channel, the cable connector received and held between said first and second resilient members.

11. The apparatus of claim 10, wherein said second resilient member includes a plurality of panels spaced along the longitudinal axis of said channel and extending outwardly from said inner wall of said second sidewall and angularly relative to the longitudinal axis of said channel.

12. The apparatus of claim 9, further comprising a cover having a first edge hingedly connected to said second sidewall and a distal second edge securable to said first sidewall, said cover pivotally moveable between an open position for providing access to said channel and a closed position for securing the cable connector within said channel.

13. The apparatus of claim 9, wherein said main body includes a first portion hingedly connected to a second portion, said latch extending outwardly from and connected to said first portion and said first resilient member connected to said second portion.

14. The apparatus of claim 13, wherein said first portion is pivotal relative to said second portion about an axis substantially transverse to a longitudinal axis of said channel.

15. The apparatus of claim 13, further comprising a cover having a first edge hingedly connected to said second sidewall and a distal second edge securable to said first sidewall, said cover pivotally moveable between an open position for providing access to said channel and a closed position for securing the cable connector within said channel.

16. The apparatus of claim 15, further comprising:
a lock plate hingedly connected to said distal second edge and including an aperture;
a first engagement member extending outwardly from said first portion; and
a second engagement member extending outwardly from said second portion, wherein said first and second engagement members are releaseably securable within said aperture when said cover is in said closed position and said base of said first portion is substantially coplanar with said base of said second portion.

17. A method comprising:
securing a first portion of a main body of a cable retention mechanism to a device so that a channel defined by the first portion is aligned with a receptacle of the device, the main body including a second portion hingedly connected to the first portion, the second portion including first and second spaced resilient members;
inserting a cable connector into the channel;

connecting a fitting portion of the cable connector to the receptacle;

pivoting the second portion of the main body toward the cable connector; and deformably tensioning the resilient members against a portion of the cable connector so that the cable connector is releasably secured within the channel when a base of the second portion is substantially coplanar with a base of the first portion.

18. The method of claim 17, including the further step of:

pivoting a cover hingedly secured to a sidewall of the main body from an open position to a closed position so that the cable connector is encased within the cable retention mechanism.

\* \* \* \* \*